US012596140B2

(12) United States Patent
Hsieh et al.

(10) Patent No.: US 12,596,140 B2
(45) Date of Patent: Apr. 7, 2026

(54) DETECTION DEVICE FOR EVALUATING INTERNAL ELECTRONIC ELEMENTS OF A TEST OBJECT

(71) Applicant: Innolux Corporation, Miaoli County (TW)

(72) Inventors: Chih-Yung Hsieh, Miaoli County (TW); Yan-Zheng Wu, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 174 days.

(21) Appl. No.: 18/360,772

(22) Filed: Jul. 27, 2023

(65) Prior Publication Data

US 2024/0069083 A1     Feb. 29, 2024

Related U.S. Application Data

(60) Provisional application No. 63/402,081, filed on Aug. 30, 2022.

(30) Foreign Application Priority Data

Jun. 2, 2023     (CN) .......................... 202310649538.4

(51) Int. Cl.
 *G01R 29/08* (2006.01)
(52) U.S. Cl.
 CPC ................................. *G01R 29/0878* (2013.01)
(58) Field of Classification Search
 CPC ............ G01R 29/0878; G01R 29/0871; H01Q 19/062; H01Q 21/0006
 See application file for complete search history.

(56) References Cited

U.S. PATENT DOCUMENTS

| | | | | |
|---|---|---|---|---|
| 11,245,478 | B1 * | 2/2022 | Dunne ................... | H04B 17/29 |
| 2006/0267848 | A1 * | 11/2006 | Nagashima ............ | G01R 29/10 |
| | | | | 343/703 |
| 2014/0302797 | A1 * | 10/2014 | Han ...................... | H04W 24/06 |
| | | | | 455/67.14 |
| 2020/0021370 | A1 * | 1/2020 | Huynh ............... | G01R 29/0878 |
| 2020/0220628 | A1 * | 7/2020 | Vella-Coleiro ...... | G01R 29/105 |
| 2021/0148958 | A1 * | 5/2021 | Abadie ............. | G01R 29/0871 |

FOREIGN PATENT DOCUMENTS

| | | |
|---|---|---|
| TW | 201819897 | 6/2018 |
| TW | 202006338 | 2/2020 |
| TW | 202032140 | 9/2020 |

OTHER PUBLICATIONS

"Office Action of Taiwan Counterpart Application", issued on Apr. 15, 2025, p. 1-p. 6.

* cited by examiner

*Primary Examiner* — Alvaro E Fortich
(74) *Attorney, Agent, or Firm* — JCIPRNET

(57) ABSTRACT

A detection device detects an output electromagnetic wave signal passing through a test object. The detection device includes an electromagnetic wave signal generating unit, an output element, a receiving element and a measuring unit. The electromagnetic wave signal generating unit is used for generating an initial electromagnetic wave signal. The output element is used for outputting the initial electromagnetic wave signal. The receiving element is used for receiving the output electromagnetic wave signal. The measuring unit is used for measuring the value of the output electromagnetic wave signal.

8 Claims, 10 Drawing Sheets

DETECTION DEVICE FOR EVALUATING INTERNAL ELECTRONIC ELEMENTS OF A TEST OBJECT

CROSS-REFERENCE TO RELATED APPLICATION

This application claims the priority benefits of U.S. provisional application Ser. No. 63/402,081, filed on Aug. 30, 2022, and China application serial no. 202310649538.4, filed on Jun. 2, 2023. The entirety of each of the above-mentioned patent applications is hereby incorporated by reference herein and made a part of this specification.

BACKGROUND

Field of the Disclosure

The present disclosure relates to an electronic device, and more particularly to a detection device.

Description of Related Art

It is impossible to determine whether high-frequency characteristics of an antenna device are normal through appearance inspection or illuminating test, so it is required to develop a detection device capable of determining the high-frequency characteristics of an antenna device.

SUMMARY OF THE DISCLOSURE

The present disclosure provides a detection device capable of determining high-frequency characteristics of an antenna device.

In an embodiment of the disclosure, the detection device is configured to detect an output electromagnetic wave signal passing through a test object. The detection device includes an electromagnetic wave signal generating unit, an output element, a receiving element and a measuring unit. The electromagnetic wave signal generating unit is configured to generate an initial electromagnetic wave signal. The output element is configured to output the initial electromagnetic wave signal. The receiving element is configured to receive the output electromagnetic wave signal. The measuring unit is configured to measure a value of the output electromagnetic wave signal.

In another embodiment of the present disclosure, the detection device is configured to detect the output electromagnetic wave signal reflected by the test object. The detection device includes an electromagnetic wave signal generating unit, an output and receiving element, a multiplexer and a measuring unit. The electromagnetic wave signal generating unit is configured to generate an initial electromagnetic wave signal. The multiplexer is coupled to the output and receiving element to switch the output and receiving element to output the initial electromagnetic wave signal or receive the output electromagnetic wave signal. The measuring unit is configured to measure a value of the output electromagnetic wave signal.

In order to make the above-mentioned features and advantages of the present disclosure more comprehensible, the following specific embodiments are described in detail in conjunction with the accompanying drawings.

BRIEF DESCRIPTION OF THE DRAWINGS

The accompanying drawings are included to provide a further understanding of the disclosure, and are incorporated in and constitute a part of this specification. The drawings illustrate of the disclosure and, together with the description, serve to explain the principles of the disclosure.

DESCRIPTION OF EMBODIMENTS

Figure 1:
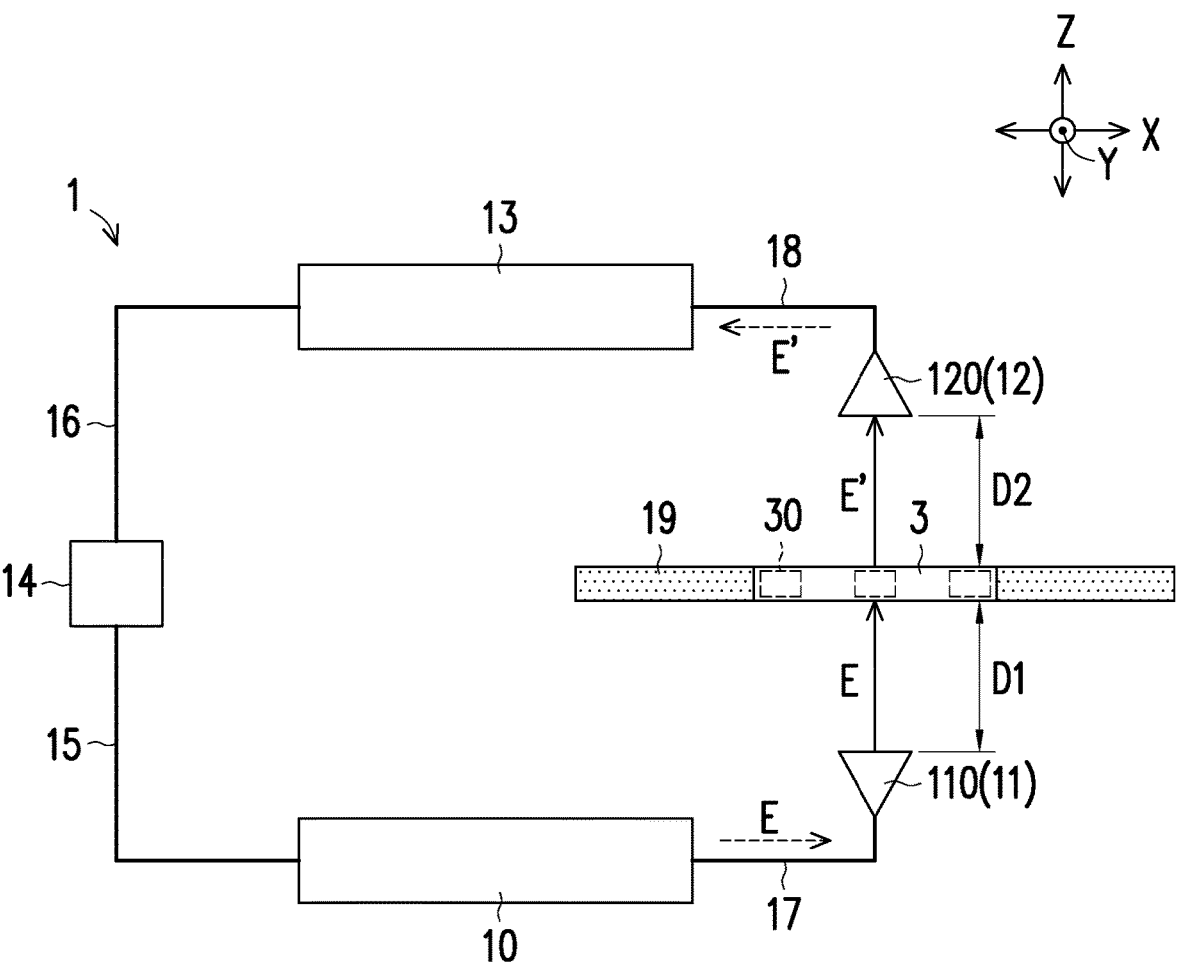
FIG. 1 to FIG. 8 are schematic diagrams of a plurality of detection devices according to different embodiments of the present disclosure, respectively.

Reference will now be made in detail to the exemplary embodiments of the present disclosure, examples of which are illustrated in the accompanying drawings. Wherever possible, the same reference numbers are used in the drawings and descriptions to refer to the same or like parts.

Certain terms will be used throughout the specification and appended claims of this disclosure to refer to particular elements. Those skilled in the art should understand that electronic device manufacturers may refer to the same component by different names. The text does not intend to distinguish between those elements that have the same function but have different names. In the following description and claims, terms such as "comprising" and "including" are open-ended words, so they should be interpreted as meaning "including but not limited to . . . ".

The directional terms mentioned herein, such as "upper", "lower", "front", "rear", "left", "right", etc., only refer to the directions of the accompanying drawings. Accordingly, the directional terms are used for illustration, not for limitation of the present disclosure. In the drawings, each figure illustrates the general characteristics of methods, structures and/or materials used in particular embodiments. However, these drawings should not be interpreted as defining or limiting the scope or nature encompassed by these embodiments. For example, the relative sizes, thicknesses and positions of layers, regions and/or structures may be reduced or exaggerated for clarity.

A structure (or layer, element, substrate) described in this disclosure is located on/over another structure (or layer, element, substrate), which can mean that the two structures are adjacent and directly connected, or it can mean that the two structures are adjacent rather than directly connected. Indirect connection means that there is at least one intermediate structure (or intermediate layer, intermediate element, intermediate substrate, intermediate space) between two structures, and the lower surface of a structure is adjacent to or directly connected to the upper surface of the intermediate structure. The upper surface of the other structure is adjacent to or directly connected to the lower surface of the intermediate structure. The intermediate structure can be composed of a single-layer or multi-layer physical structure or a non-physical structure, the disclosure is not limited thereto. In this disclosure, when a certain structure is set "on" other structures, it may mean that a certain structure is "directly" on other structures, or that a certain structure is "indirectly" on other structures, that is, there is at least one structure interposed between a certain structure and other structures.

A structure (or element) described in this disclosure is connected to another structure (or element), which can mean that the two structures are directly connected, or it can mean that the two structures are indirectly connected. Indirect connection means that there is at least one intermediate structure (or intermediate element) between two structures. The intermediate structure can be composed of a single structure or multi-component structures.

The terms "about", "equal to", "equivalent to" or "identical", "substantially" or "generally" are normally interpreted as being within 10% of a given value or range, or as being within 5%, 3%, 2%, 1%, or 0.5% of a given value or range. In addition, the description that "the range is from the first value to the second value" and "the range is between the first value and the second value" mean that the range includes the first value, the second value and other values therebetween.

Ordinal numbers used in the specification and claims, such as "first", "second", etc., are used to modify elements, which neither implies nor means that the (or these) elements are preceded by any ordinal numbers, nor indicates the order of a certain element with another element, or the order of the manufacturing method. The use of these ordinal numbers is only used to clearly distinguish the element with a certain name from another element with the same name. Different terms may be adopted in claims and the specification, accordingly, the first component in the description may be referred to as the second component in the claim.

The electrical connection or coupling described in this disclosure can refer to direct connection or indirect connection. In the case of direct connection, the terminals of the elements on the two circuits are directly connected or connected to each other with a conductor line segment. In the case of indirect connection, there are switches, diodes, capacitors, inductors, resistors, other suitable elements, or a combination of the above elements between the terminals of the elements on the two circuits, but not limited thereto.

In this disclosure, the thickness, length and width may be measured by optical microscope (OM), and the thickness or width may be obtained by measuring the cross-sectional image in the electron microscope, but the disclosure is not limited thereto. Additionally, any two values or directions used for comparison may have certain errors. In addition, the terms "equal to", "equivalent to", "same", "substantially" or "generally" mentioned in the present disclosure generally mean that a value falls within 10% of a given value or range. Moreover, the phrase "a given range is between a first value and a second value", "a given range falls within a range of a first value to a second value" or "a given range is between a first value and a second value" means that the given range includes the first value, the second value and other values therebetween. If the first direction is perpendicular to the second direction, the angle between the first direction and the second direction can be between 80 degrees and 100 degrees; if the first direction is parallel to the second direction, the angle between the first direction and the second direction may be between 0 degrees and 10 degrees.

Unless otherwise defined, all terms (including technical and scientific terms) used herein have the same meaning as commonly understood by one of ordinary skill in the art to which this disclosure belongs. It can be understood that these terms, such as those defined in commonly used dictionaries, should be interpreted as having meanings consistent with the background or context of the related technology and the present disclosure, and should not be interpreted in an idealized or overly formal manner, unless otherwise specified in the disclosed embodiments.

In the present disclosure, the electronic device may include a display device, a backlight device, an antenna device, a sensing device, a detection device or a splicing device, but not limited thereto. The electronic device may be a bendable or flexible electronic device. The display device may be a non-self-luminous display device or a self-luminous display device. The display device may include, for example, liquid crystal, light-emitting diode, fluorescence, phosphor, quantum dot (QD), other suitable display media, or a combination thereof. The antenna device may include, for example, a frequency selective surface (FSS), a radio frequency filter (RF-Filter), a polarizer, a resonator or an antenna, etc. The antenna device may be a liquid crystal type antenna device or a non-liquid crystal type antenna device, and the sensing device may be a sensing device for sensing capacitance, light, thermal energy or ultrasonic wave signals. The detection device may be configured to sense light, thermal energy, ultrasonic wave signals or electromagnetic wave signals, but not limited thereto. In the present disclosure, an electronic device may include electronic components, and the electronic components may include passive components and active components, such as capacitors, resistors, inductors, diodes, transistors, sensors, integrated circuits and the like. The diodes may include light-emitting diodes, photodiodes or varactors. The light-emitting diode may include, for example, an organic light emitting diode (OLED), a mini light-emitting diode (mini LED), a micro light-emitting diode (micro LED) or a quantum dot light-emitting diode (quantum dot LED), but not limited thereto. The splicing device may be, for example, a display splicing device or an antenna splicing device, but is not limited thereto. It should be noted that the electronic device can be any permutation and combination of the aforementioned, but not limited thereto. In addition, the shape of the electronic device may be rectangular, circular, polygonal, with curved edges, or other suitable shapes. An electronic device may have peripheral systems such as a drive system, a control system, a light source system, . . . to support a display device, an antenna device, a wearable device (such as including augmented reality or virtual reality), a vehicle-mounted device (such as including a car windshield), or a splicing device.

It should be noted that, in the following embodiments, without departing from the spirit of the present disclosure, the features in several different embodiments can be replaced, reorganized, and mixed to complete other embodiments. As long as the features of the various embodiments do not violate the spirit of the disclosure or conflict with each other, they can be mixed and matched freely.

FIG. 1 to FIG. 8 are schematic diagrams of a plurality of detection devices according to different embodiments of the present disclosure, respectively. Each of FIG. 1 to FIG. 8 also depicts the test object, so as to facilitate comprehension of the relative arrangement relationship between the detection device and the test object.

Please refer to FIG. 1 first, a test object 3 is, for example, a penetrating antenna device or a partially penetrating antenna device, that is, the test object 3 has at least one electromagnetic wave signal penetrating area. The test object 3 may include a plurality of electronic elements 30. A plurality of electronic elements 30 are arranged corresponding to one or more electromagnetic wave signal penetrating areas of the test object 3. In the figure, the areas where three electronic elements 30 are located (such as three electromagnetic wave signal penetrating areas) are schematically shown in boxes illustrated in dashed lines, but it should be understood that the types of components and the number of components in the test object 3 may be changed according to actual needs.

The electronic element 30 is, for example, an adjustable element, such as a varactor, but not limited thereto. By providing a bias voltage to the varactor diode, the equivalent capacitance of the varactor diode may be controlled, so that after the electromagnetic wave signal (such as the output electromagnetic wave signal E') passes through the electromagnetic wave signal penetrating area, the phase and amplitude of the electromagnetic wave signal may change accordingly, thereby controlling and/or adjusting the direction of the output electromagnetic wave signal E' or the directivity of the antenna device.

When a plurality of electronic elements 30 are coupled to a plurality of pads (not shown) in the test object 3 (such as an antenna device), poor contact or dislocation might occur. In some embodiments of the present disclosure, the detection device 1 may be configured to detect the output electromagnetic wave signal E' passing through the test object 3. By detecting the output electromagnetic wave signal E' passing through the test object 3 by the detection device 1, it is possible to determine whether the intensity of the resonant frequency point of the plurality of electronic elements 30 is enhanced due to abnormal contact, and it is possible to detect the contact status of the plurality of electronic elements 30 while verifying the high-frequency characteristics of the test object 3, for example, defects such as poor contact or dislocation are detected. In addition, when a defect is identified, feedback or repair may be performed in time.

The detection device 1 may include an electromagnetic wave signal generating unit 10, an output element 11, a receiving element 12, and a measuring unit 13. The electromagnetic wave signal generating unit 10 is configured to generate an initial electromagnetic wave signal E. The output element 11 is configured to output the initial electromagnetic wave signal E. The receiving element 12 is configured to receive the output electromagnetic wave signal E'. The measuring unit 13 is configured to measure the value of the output electromagnetic wave signal E'.

In detail, the electromagnetic wave signal generating unit 10 may include an electromagnetic wave signal generator, and the initial electromagnetic wave signal E may be a radio frequency signal, a millimeter wave signal, a Terahertz (THz) wave signal or an electromagnetic wave signal in other frequency ranges, the present disclosure is not limited thereto.

The output element 11 is coupled to the electromagnetic wave signal generating unit 10 and configured to transmit the initial electromagnetic wave signal E toward the test object 3. In some embodiments, the output element 11 may include one or more output units 110 (only one is shown schematically in the figure), such as one or more transmitting antennas, but not limited thereto. In some embodiments, the distance D1 (for example, the shortest distance in the direction Z) between the output element 11 and the test object 3 may be greater than $0.62 \times \sqrt{D^3/\lambda}$, so that the initial electromagnetic wave signal E transmitted to the test object 3 is a plane wave signal or an approximate plane wave signal. In the above formula, $\lambda$ is the wavelength of the initial electromagnetic wave signal E, and D is the size of the output unit 110 (such as an antenna unit) in a top view (the XY plane formed by the direction X and the direction Y). The direction X, the direction Y and the direction Z are different from each other, for example, the direction X, the direction Y and the direction Z are perpendicular to each other, but not limited thereto. For example, if the shape of the output unit 110 in the top view is polygonal, then D is the side length of the polygon; if the shape of the output unit 110 in the top view is a circle, then D is the diameter of the circle.

The initial electromagnetic wave signal E transmitted from the output element 11 to the test object 3 will be converted into an output electromagnetic wave signal E' by the electronic element 30 when passing through the test object 3. The output electromagnetic wave signal E' has at least one radio frequency parameter different from the initial electromagnetic wave signal E. The radio frequency parameters may include radiation intensity, resonance frequency, phase, and transmission direction, etc., and the present disclosure is not limited thereto.

The receiving element 12 is arranged on the transmission path of the output electromagnetic wave signal E' to receive the output electromagnetic wave signal E'. In some embodiments, the receiving element 12 may include one or more receiving units 120 (only one is schematically shown in the figure), such as a receiving antenna, but not limited thereto. In some embodiments, the distance D2 (for example, the shortest distance in the direction Z) between the receiving element 12 and the test object 3 may be equal to the distance D1, but not limited thereto.

The measuring unit 13 is coupled to the receiving element 12 to measure the value of the output electromagnetic wave signal E' received by the receiving element 12. The measuring unit 13 may include a radio frequency power meter (RF power meter), and the measuring unit 13 may convert the output electromagnetic wave signal E' into an electrical signal, but not limited thereto.

According to different requirements, the detection device 1 may further include other elements. For example, the detection device 1 may further include a processor 14. The processor 14 is coupled to the electromagnetic wave signal generating unit 10 and the measuring unit 13, and the processor 14 may perform a signal transmission with the electromagnetic wave signal generating unit 10 or the measuring unit 13 in a wired or wireless manner. The processor 14 may be, for example, a computer, but is not limited thereto. Under the framework of wired transmission, the detection device 1 may further include a signal line 15 and a signal line 16. The processor 14 may transmit a control signal to the electromagnetic wave signal generating unit 10 through the signal line 15, so that the electromagnetic wave signal generating unit 10 generates the initial electromagnetic wave signal E. In addition, the processor 14 may receive an electrical signal from the measuring unit 13 through the signal line 16. Under the framework of wireless transmission, the detection device 1 may omit the signal line 15 and the signal line 16.

In some embodiments, the detection device 1 may further include a signal line 17 and a signal line 18. The signal line 17 is coupled between the electromagnetic wave signal generating unit 10 and the output element 11 to transmit the initial electromagnetic wave signal E from the electromagnetic wave signal generating unit 10 to the output element 11. The signal line 18 is coupled between the receiving element 12 and the measuring unit 13 to transmit the output electromagnetic wave signal E' from the receiving element 12 to the measuring unit 13. The signal line 17 and the signal line 18 may be, for example, radio frequency cables (RF cables), but are not limited thereto.

In some embodiments, the detection device 1 may further include a clamping element 19 to fix the position of the test object 3. In some embodiments, although not shown, the testing device 1 may further include a moving device so that the test object 3 may be moved relative to the output element 11 and the receiving element 12 in the direction X, the direction Y or the direction Z. For example, when performing defect detection, the positions of the output element 11 and the receiving element 12 may be fixed, and the moving device may be utilized to control the clamping element 19 to move in the direction X, direction Y or direction Z, so that the test object 3 may be moved relative to the output element 11 and the receiving element 12. Alternatively, when performing defect detection, the positions of the test object 3 and the clamping element 19 may be fixed, and a moving device may be utilized to control the movement of the output element 11 and the receiving element 12, so that the test object 3 may be moved relative to the output element 11 and the receiving element 12, but the present disclosure is not limited thereto.

Figure 2:
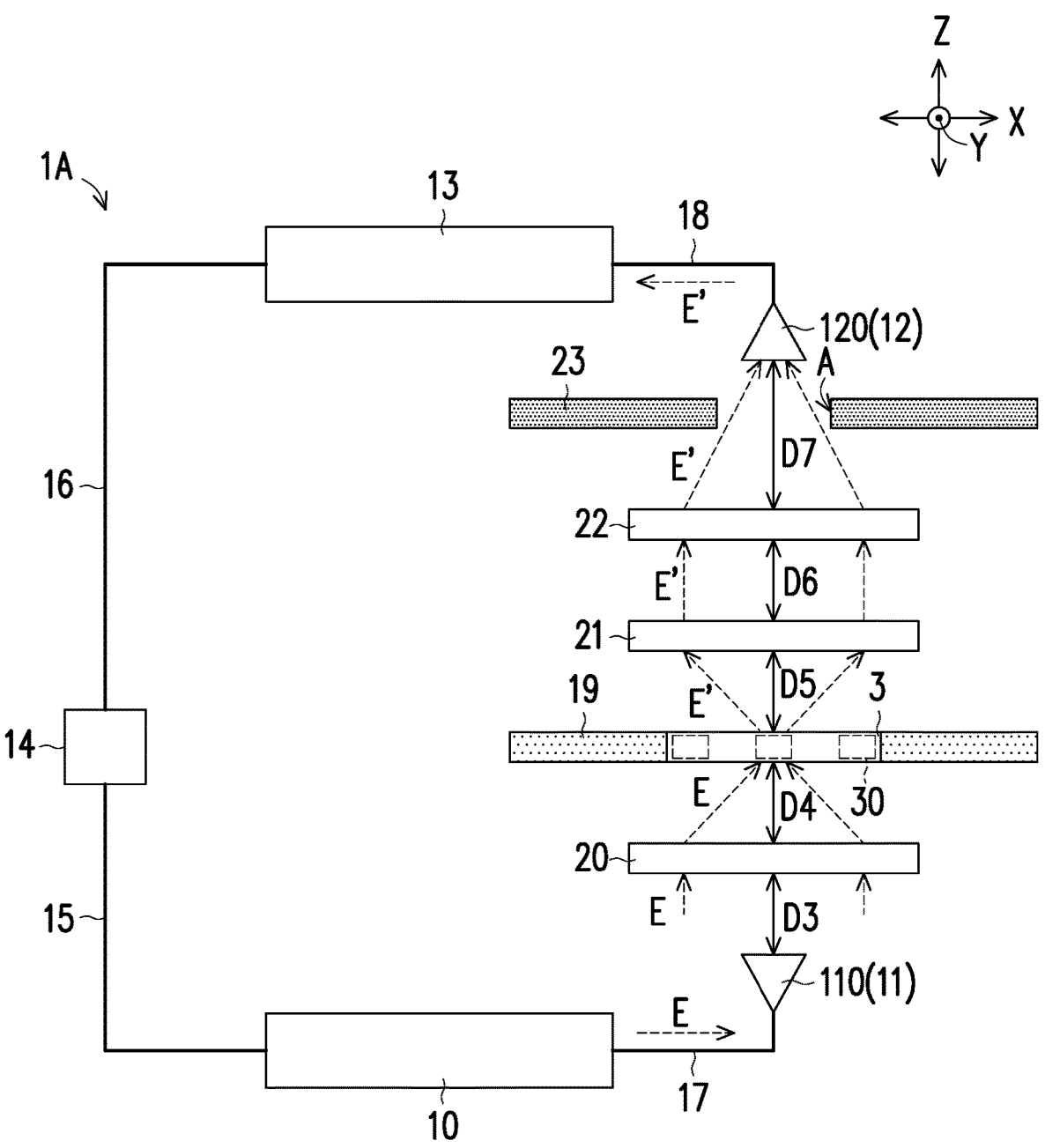

Referring to FIG. 2, the main differences between the detection device 1A and the detection device 1 in FIG. 1 are described below. The detection device 1A further includes a first lens unit 20, a second lens unit 21 and a third lens unit 22. The first lens unit 20 is arranged between the output element 11 and the receiving element 12, the second lens unit 21 is arranged between the first lens unit 20 and the receiving element 12, and the third lens unit 22 is arranged between the second lens unit 21 and the receiving element 12.

By using the lens unit (including the first lens unit 20, the second lens unit 21 or the third lens unit 22) to adjust the phase and amplitude of the initial electromagnetic wave signal E, the initial electromagnetic wave signal E may be collimated to change the transmission direction of the initial electromagnetic wave signal E or converge the initial electromagnetic wave signal E, but not limited thereto. In addition, the detection range of the test object 3 may be adjusted by setting multiple lens units (such as the first lens unit 20, the second lens unit 21 and the third lens unit 22), for example, after the initial electromagnetic wave signal E is converged, the detection range of the test object 3 may be reduced, that is, to perform defect detection for a local area in test object 3, so that the defect location may be found more accurately.

In some embodiments, the distance D3 between the output element 11 and the first lens unit 20 (for example, the shortest distance in the direction Z) may be greater than $0.62 \times \sqrt{D^3/\lambda}$, so that the initial electromagnetic wave signal E transmitted to the first lens unit 20 is a plane wave or an approximate plane wave. Specifically, $\lambda$ and D may be as described above, and further details will not be repeated here. In some embodiments, the distance D4 between the first lens unit 20 and the test object 3 (for example, the shortest distance in the direction Z) may be equal to the focal length of the first lens unit 20, so that the initial electromagnetic wave signal E that passes through the first lens unit 20 is converged to one or more electronic elements 30 in the test object 3. In some embodiments, the distance D5 (for example, the shortest distance in the direction Z) between the test object 3 and the second lens unit 21 may be equal to the focal length of the second lens unit 21, so that the second lens unit 21 may collimate the output electromagnetic wave signal E' (convert the output electromagnetic wave signal E' into a plane wave or an approximate plane wave). In some embodiments, the distance D6 (for example, the shortest distance in the direction Z) between the second lens unit 21 and the third lens unit 22 may be greater than $0.62 \times \sqrt{D^3/\lambda}$. Specifically, $\lambda$ and D may be as described above, and details will not be repeated here. In some embodiments, the distance D7 (for example, the shortest distance in the direction Z) between the third lens unit 22 and the receiving element 12 may be equal to the focal length of the third lens unit 22, so that the output electromagnetic wave signal E' that passes through the third lens unit 22 is converged to the receiving element 12.

In some embodiments, the detection device 1A may further include a filter unit 23, and the filter unit 23 may be disposed between the third lens unit 22 and the receiving element 12 to filter noise. The filter unit 23 may be formed of a material that absorbs the output electromagnetic wave signal E' and/or noise, and the filter unit 23 may include an opening A through which the output electromagnetic wave signal E' passes.

Figure 3:
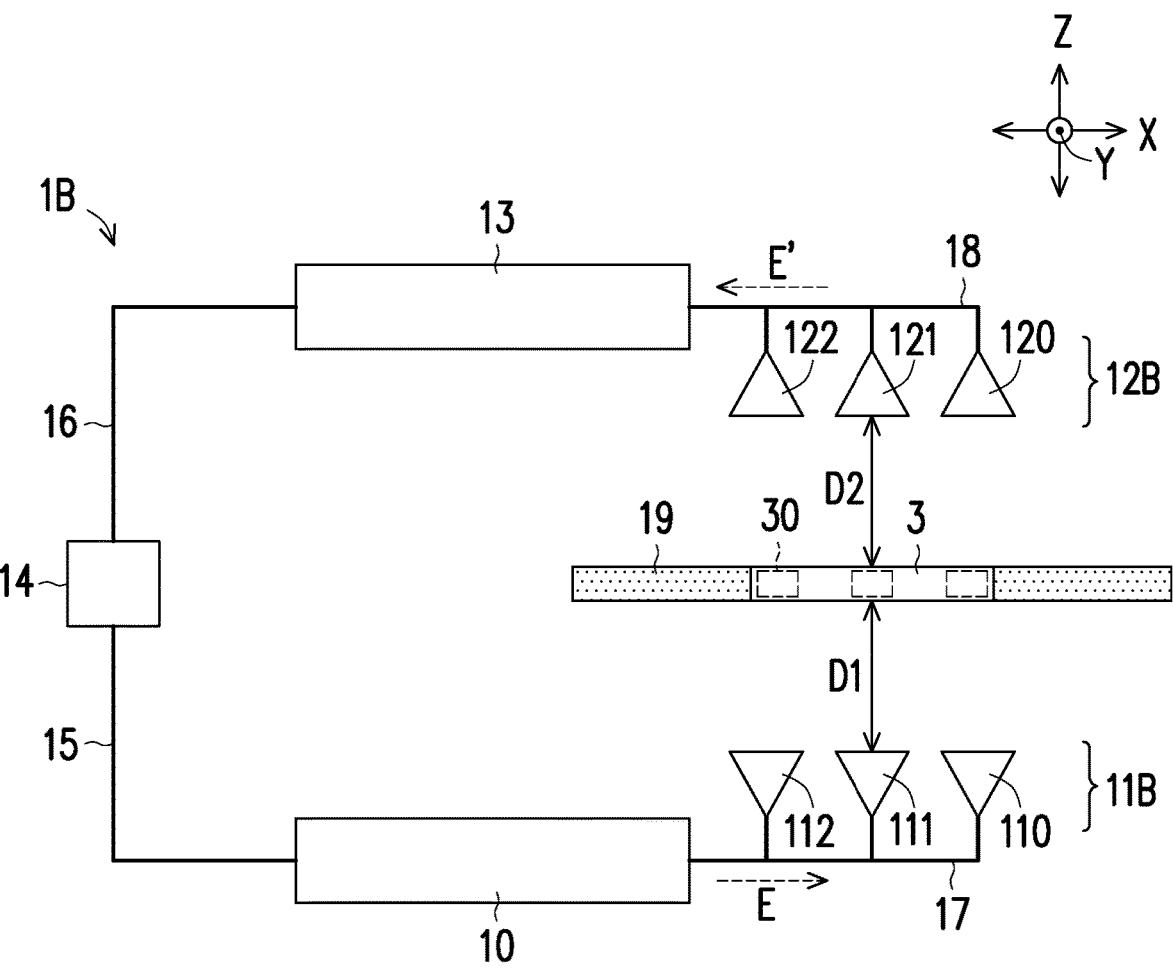

Referring to FIG. 3, the main differences between the detection device 1B and the detection device 1 in FIG. 1 are described below. In the detection device 1B, the output element 11B includes a plurality of output units (such as the output unit 110, the output unit 111 and the output unit 112), and the receiving element 12B includes a plurality of receiving units (such as the receiving unit 120, the receiving unit 121 and the receiving unit 122). Multiple output units may be arranged in an array on the plane formed by the direction X and the direction Y, and multiple receiving units may be set corresponding to multiple output units, for example, multiple receiving units overlap multiple output units respectively in the direction Z.

With the above design, the detection device 1B may simultaneously detect multiple areas of the test object 3, which helps to reduce the detection time and/or omit the setting of the moving device. For example, in the meantime, the output unit 110, the output unit 111 and the output unit 112 may respectively output the initial electromagnetic wave signal E to the three electronic elements 30 of the test object 3. The rightmost electronic element 30 of test object 3 in FIG. 3 may receive the initial electromagnetic wave signal E from the output unit 110 and convert the initial electromagnetic wave signal E into an output electromagnetic wave signal E', and the receiving unit 120 may receive the output electromagnetic wave signal E' from the rightmost electronic element 30. The middle electronic element 30 of the test object 3 in FIG. 3 may receive the initial electromagnetic wave signal E from the output unit 111 and convert the initial electromagnetic wave signal E into an output electromagnetic wave signal E', and the receiving unit 121 may receive the output electromagnetic wave signal E' from the middle electronic element 30. The leftmost electronic element 30 of the test object 3 in FIG. 3 may receive the initial electromagnetic wave signal E from the output unit 112 and convert the initial electromagnetic wave signal E into an output electromagnetic wave signal E', and the receiving unit 122 may receive the output electromagnetic wave signal E' from the leftmost electronic element 30. In the embodiment where multiple areas are detected simultaneously, the above-mentioned array may be designed to have different polarization states, for example, the initial electromagnetic wave signal E output by the output unit 110, the output unit 111 and the output unit 112 may have different polarization states, while the polarization states of the output electromagnetic wave signal E' received by the receiving unit 120, the receiving unit 121, and the receiving unit 122 respectively correspond to the polarization states of the initial electromagnetic wave signal E' output by the output unit 110, the output unit 111, and the output unit 112, respectively, so as to distinguish the signals passing through different electronic elements 30.

Figure 4:
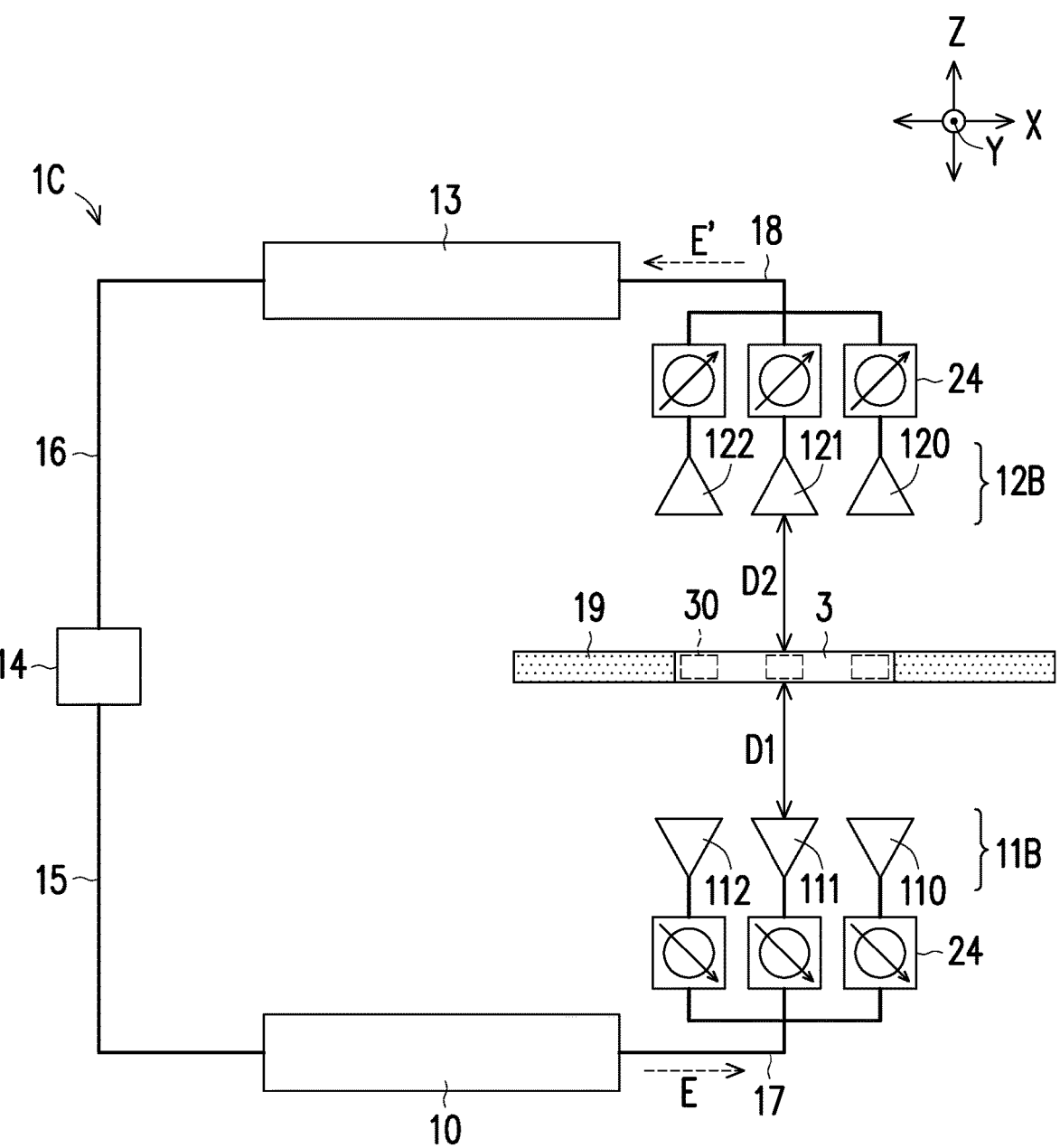

Please refer to FIG. 4, the main difference between the detection device 1C and the detection device 1B of FIG. 3 is that the detection device 1C may further include a phase adjustment element 24, which is arranged at least one of the following positions: between the output element 11B and the electromagnetic wave signal generating unit 10; and between the receiving element 12B and the measuring unit 13.

Modulating the phase and/or amplitude of the initial electromagnetic wave signal E by the phase adjustment element 24 makes it possible to change the transmission direction of the initial electromagnetic wave signal E or adjust the detection range of detecting the test object 3. For example, the range of detecting the test object 3 may be reduced, that is, defect detection is performed on a local area of the test object 3, so that it is possible to obtain the defect position more accurately and/or omit the setting of the moving device. For example, by adjusting the phases of the initial electromagnetic wave signal E supplied to the output unit 110, the output unit 111, and the output unit 112, so that the initial electromagnetic wave signal E from the output unit 110, the output unit 111, and the output unit 112 are simultaneously emitted to the rightmost electronic element 30 of the test object 3 at a first time, simultaneously emitted to the middle electronic element 30 of the test object 3 at a second time, and simultaneously emitted to the leftmost electronic element 30 of the test object 3 at a third time.

When there are the same number of multiple output units, multiple receiving units, and multiple electronic elements 30, multiple phase adjustment elements 24 may be arranged between the output element 11B and the electromagnetic wave signal generating unit 10, and multiple phase adjustment elements 24 between the receiving element 12B and the measuring unit 13 in FIG. 4 may be omitted. In another embodiment, if the number of multiple output units and the number of multiple receiving units are less than the number of multiple electronic elements 30, then multiple phase adjustment elements 24 may be arranged between the output element 11B and the electromagnetic wave signal generating unit 10, and another multiple phase adjustment elements 24 may be arranged between the receiving element 12B and the measuring unit 13. In another embodiment, if the number of multiple output units is less than the number of multiple electronic elements 30, and the number of multiple receiving units is equal to the number of multiple electronic elements 30, then multiple phase adjustment elements 24 may be arranged between the output element 11B and the electromagnetic wave signal generating unit 10, and multiple phase adjustment elements 24 between the receiving element 12B and the measuring unit 13 in FIG. 4 may be omitted. In another embodiment, if the number of multiple receiving units is less than the number of multiple electronic elements 30, and the number of multiple output units is equal to the number of multiple electronic elements 30, then the multiple phase adjustment elements 24 may be arranged between the receiving element 12B and the measuring unit 13, and the multiple phase adjustment elements 24 between the output element 11B and the electromagnetic wave signal generating unit 10 in FIG. 4 may be omitted.

Figure 5:
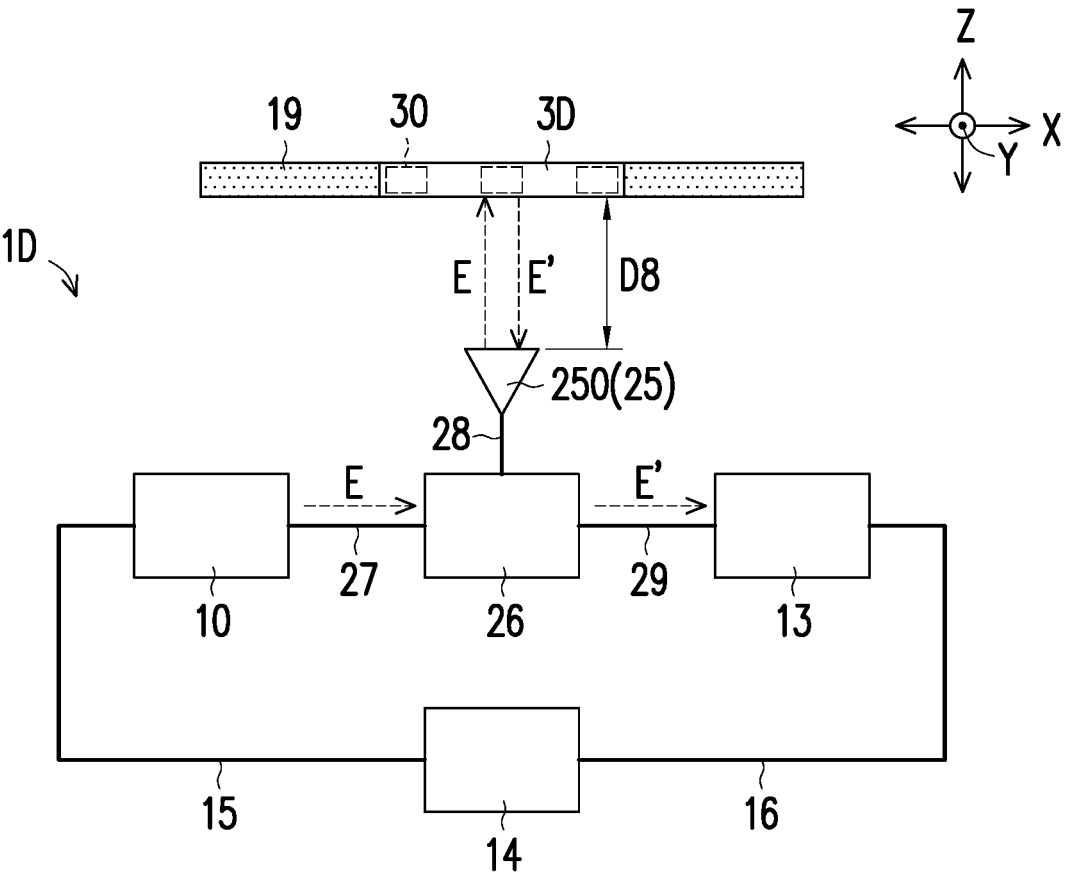

Referring to FIG. 5, in another embodiment, the test object 3D is, for example, a reflective antenna device or a partially reflective antenna device, that is, the test object 3D has at least one electromagnetic wave signal reflection area, and a plurality of electronic elements 30 are arranged corresponding to one or more electromagnetic wave signal reflection areas of the test object 3D. The area where three electronic elements 30 are located (such as three electromagnetic wave signal reflection areas) is schematically shown in a box illustrated in dashed lines, but it should be understood that the types of elements and the quantity of elements in the test object 3D may vary depending on actual needs.

In some embodiments of the present disclosure, the detection device 1D may be configured to detect the output electromagnetic wave signal E' reflected by the test object 3D. The output electromagnetic wave signal E' reflected by the test object 3D (such as an antenna device) is detected by the detection device 1D to determine whether the intensity of the resonant frequency point of the plurality of electronic elements 30 is enhanced due to abnormal contact. In this manner, it is possible to detect the contact status of the plurality of electronic elements 30 while verifying the high-frequency characteristics of the test object 3D, for example, defects such as poor contact or dislocation are detected. In addition, when a defect is identified, feedback or repair may be performed in time.

The detection device 1D may include an electromagnetic wave signal generating unit 10, an output and receiving element 25, a multiplexer 26, and a measuring unit 13. The electromagnetic wave signal generating unit 10 is configured to generate an initial electromagnetic wave signal E. The multiplexer 26 is coupled to the output and receiving element 25 for switching the output and receiving element 25 so that the output and receiving element 25 is able to output the initial electromagnetic wave signal E or receive the output electromagnetic wave signal E'. The measuring unit 13 is configured to generate the value of the output electromagnetic wave signal E'.

In detail, the multiplexer 26 is coupled to the electromagnetic wave signal generating unit 10, the output and receiving element 25, and the measuring unit 13, and the multiplexer 26 may be used to isolate the transmitting and receiving signals (electromagnetic wave signals) on the same transmission path. For example, the multiplexer 26 may include a duplexer, and the multiplexer 26 is configured to transmit the initial electromagnetic wave signal E toward the output and receiving element 25, and the multiplexer 26 is also configured to transmit the output electromagnetic wave signal E' toward the measuring unit 13.

The output and receiving element 25 is coupled to the multiplexer 26. The output and receiving element 25 is configured to transmit the initial electromagnetic wave signal E towards the test object 3D, and the output and receiving element 25 is also used to transmit the output electromagnetic wave signal E' from the test object 3D towards the multiplexer 26. In some embodiments, the output and receiving element 25 may include one or more output and receiving units 250 such as one or more output and receiving antennas, but is not limited thereto. In some embodiments, the distance D8 (for example, the shortest distance in the direction Z) between the output and receiving element 25 and the test object 3D may be greater than $0.62 \times \sqrt{D^3/\lambda}$, so that the initial electromagnetic wave signal E transmitted to the test object 3D is a plane wave or an approximate plane wave, where $\lambda$ and D may be as mentioned above, and details will not be repeated here.

The initial electromagnetic wave signal E transmitted from the output and receiving element 25 to the test object 3D is converted into an output electromagnetic wave signal E' by the electronic element 30, and the output electromagnetic wave signal E' is reflected by the test object 3D to the output and receiving element 25 and transmitted to the measuring unit 13 through the multiplexer 26.

According to different requirements, the detection device 1D may further include other elements. For example, the detection device 1D may further include a processor 14. In some embodiments, the detection device 1D may further include a signal line 15 and a signal line 16, but not limited thereto. In other embodiments, the detection device 1D may omit the signal line 15 and the signal line 16.

In some embodiments, the detection device 1D may further include a signal line 27, a signal line 28, and a signal line 29. The signal line 27 is coupled between the electromagnetic wave signal generating unit 10 and the multiplexer 26 to transmit the initial electromagnetic wave signal E from the electromagnetic wave signal generating unit 10 to the multiplexer 26. The signal line 28 is coupled between the multiplexer 26 and the output and receiving element 25, so as to transmit the initial electromagnetic wave signal E from the multiplexer 26 to the output and receiving element 25 or transmit the output electromagnetic wave signal E' from the output and receiving element 25 to the multiplexer 26. The signal line 29 is coupled between the multiplexer 26 and the measurement unit 13, so as to transmit the output electromagnetic wave signal E' from the multiplexer 26 to the measurement unit 13. The signal line 27, the signal line 28 and the signal line 29 may be, for example, radio frequency cables, but are not limited thereto.

In some embodiments, the detection device 1D may further include a clamping element 19. In some embodiments, although not shown, the detection device 1D may further include a moving device so that the test object 3D may be moved relative to the output and receiving element 25 in the direction X, the direction Y or the direction Z. For example, when performing defect detection, the position of the output and receiving element 25 may be fixed, and the moving device may be used to control the clamping element 19 to move in the direction X, direction Y or direction Z, so that the test object 3D may be moved relative to the output and receiving element 25. Alternatively, the positions of the test object 3D and the clamping element 19 may be fixed during defect detection, and a moving device may be used to control the movement of the output and receiving element 25 so that the test object 3D may be moved relative to the output and receiving element 25.

Figure 6:
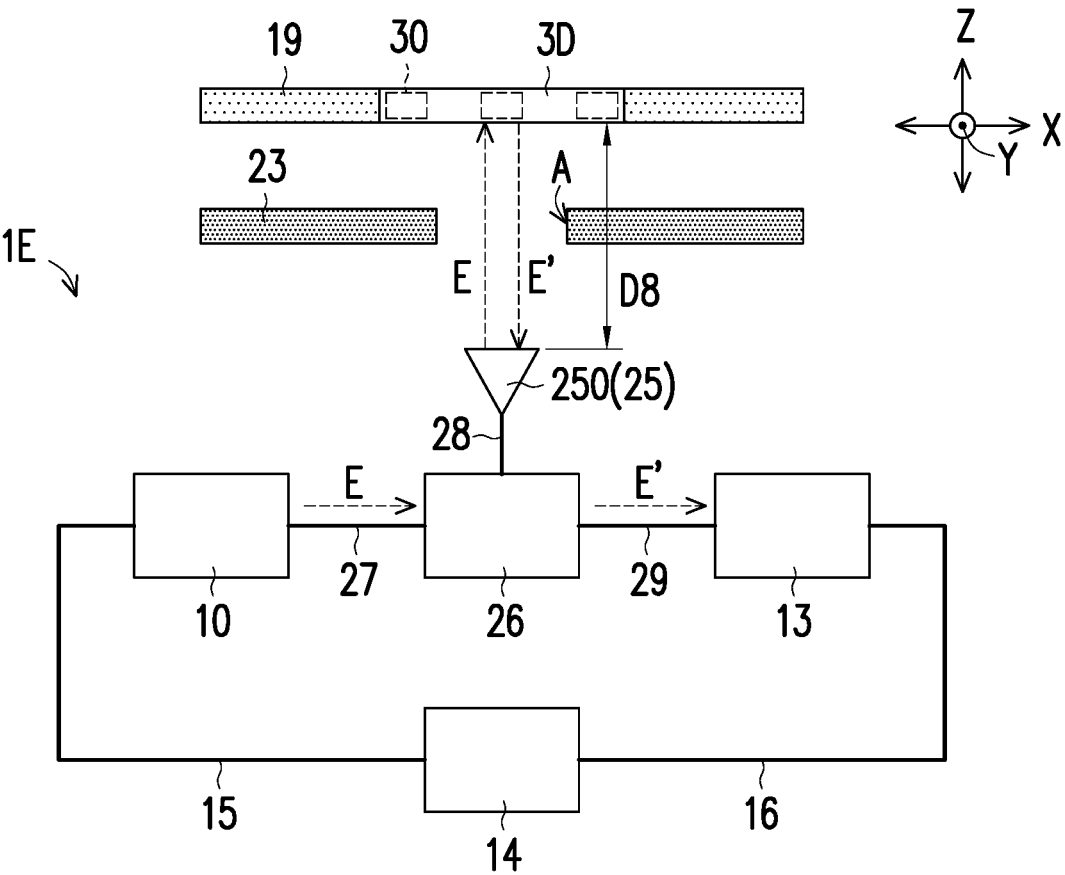

Referring to FIG. 6, the main differences between the detection device 1E and the detection device 1D in FIG. 5 are described below. The detection device 1E further includes a filter unit 23, and the output and receiving element 25 is disposed between the filter unit 23 and the multiplexer 26 to filter noise.

Figure 7:
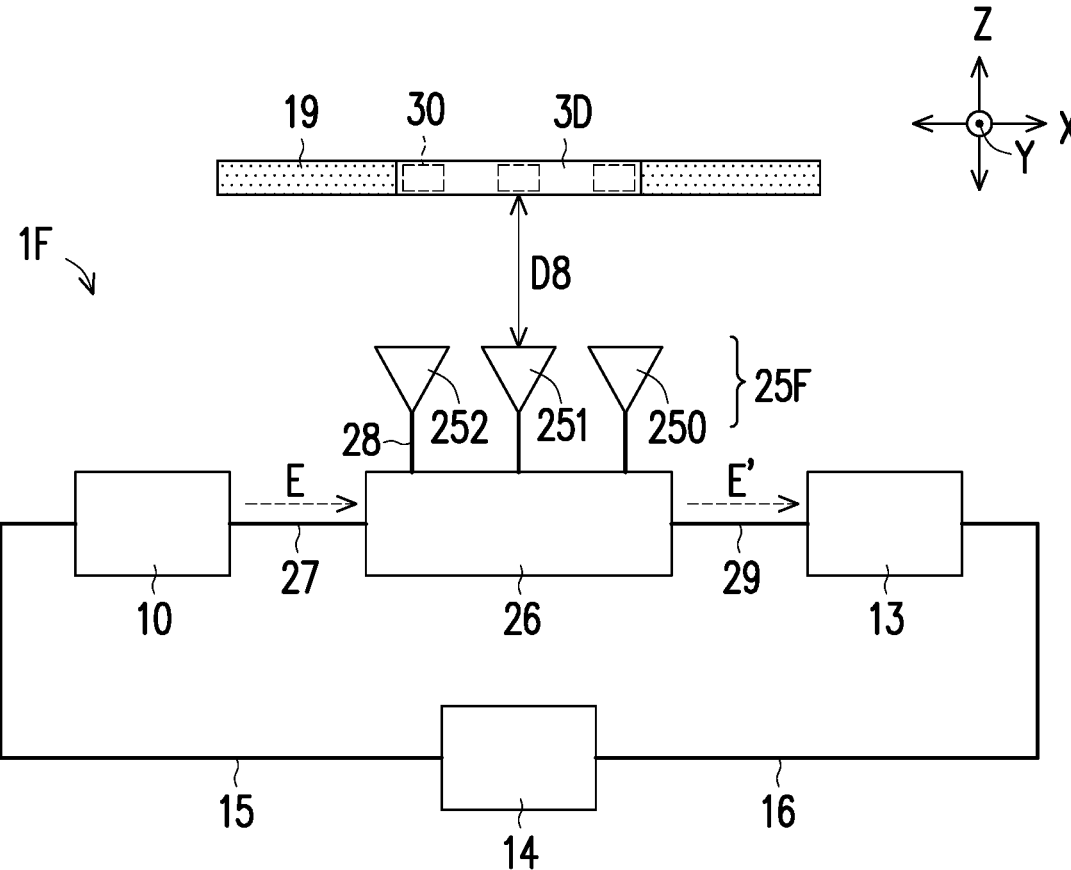

Referring to FIG. 7, the main differences between the detection device 1F and the detection device 1D in FIG. 5 are described below. In the detection device 1F, the output and receiving element 25F includes a plurality of output and receiving units (such as the output and receiving unit 250, the output and receiving unit 251 and the output and receiving unit 252). A plurality of output and receiving units may be arranged in an array on a plane formed by the direction X and the direction Y. With the above design, the detection device 1F may simultaneously detect multiple areas of the test object 3D, which helps to reduce the detection time and/or omit the setting of the moving device. In the embodiment where multiple areas are detected simultaneously, the above-mentioned array may be designed to have different polarization states, so as to distinguish signals reflected from different electronic elements 30.

Figure 8:
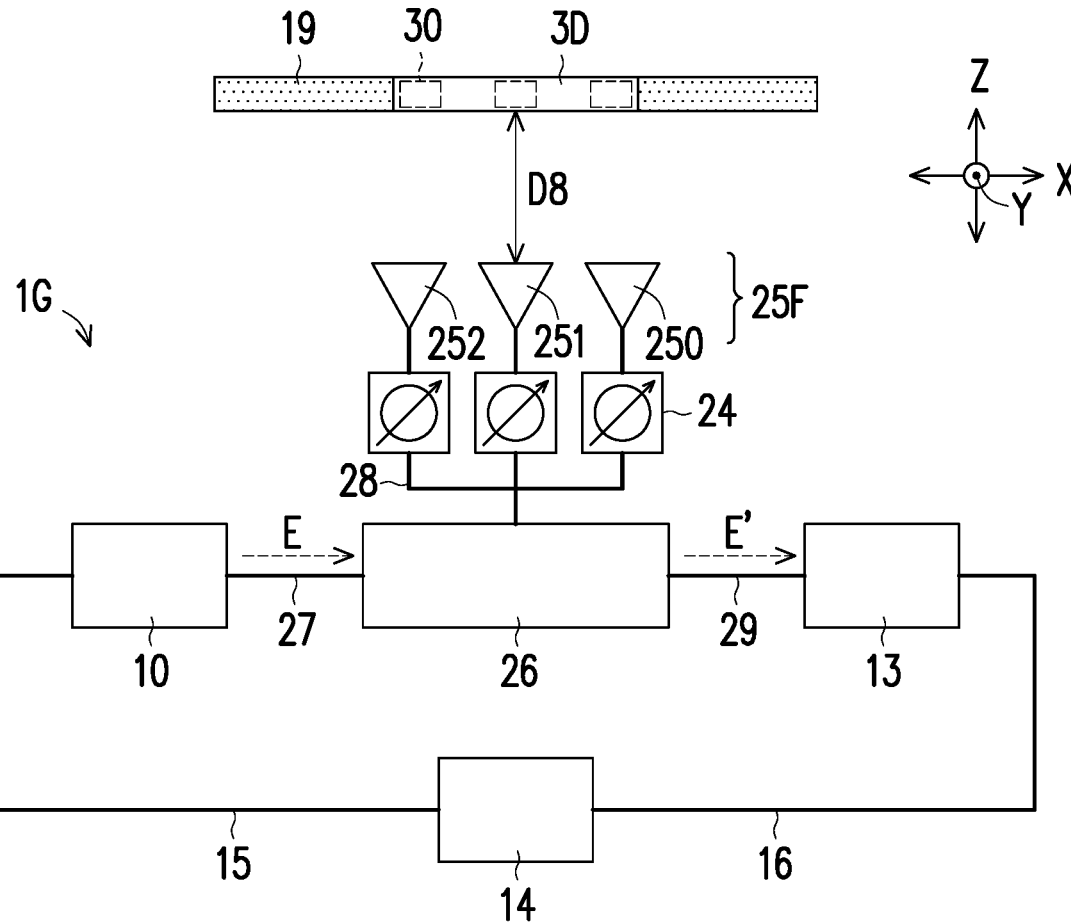

Referring to FIG. 8, the main differences between the detection device 1G and the detection device 1F in FIG. 7 are described below. The detection device 1G further includes a phase adjustment element 24 disposed between the output and receiving element 25F and the multiplexer 26. By modulating the phase and/or amplitude of the initial electromagnetic wave signal E through the phase adjustment element 24, the transmission direction of the initial electromagnetic wave signal E may be changed or the detection range of detecting the test object 3D may be adjusted. For example, the range of detecting the test object 3D may be reduced, that is, defect detection is performed on a local area of the test object 3D, so that it is possible to obtain the defect position more accurately and/or omit the setting of the moving device.

Figure 9:
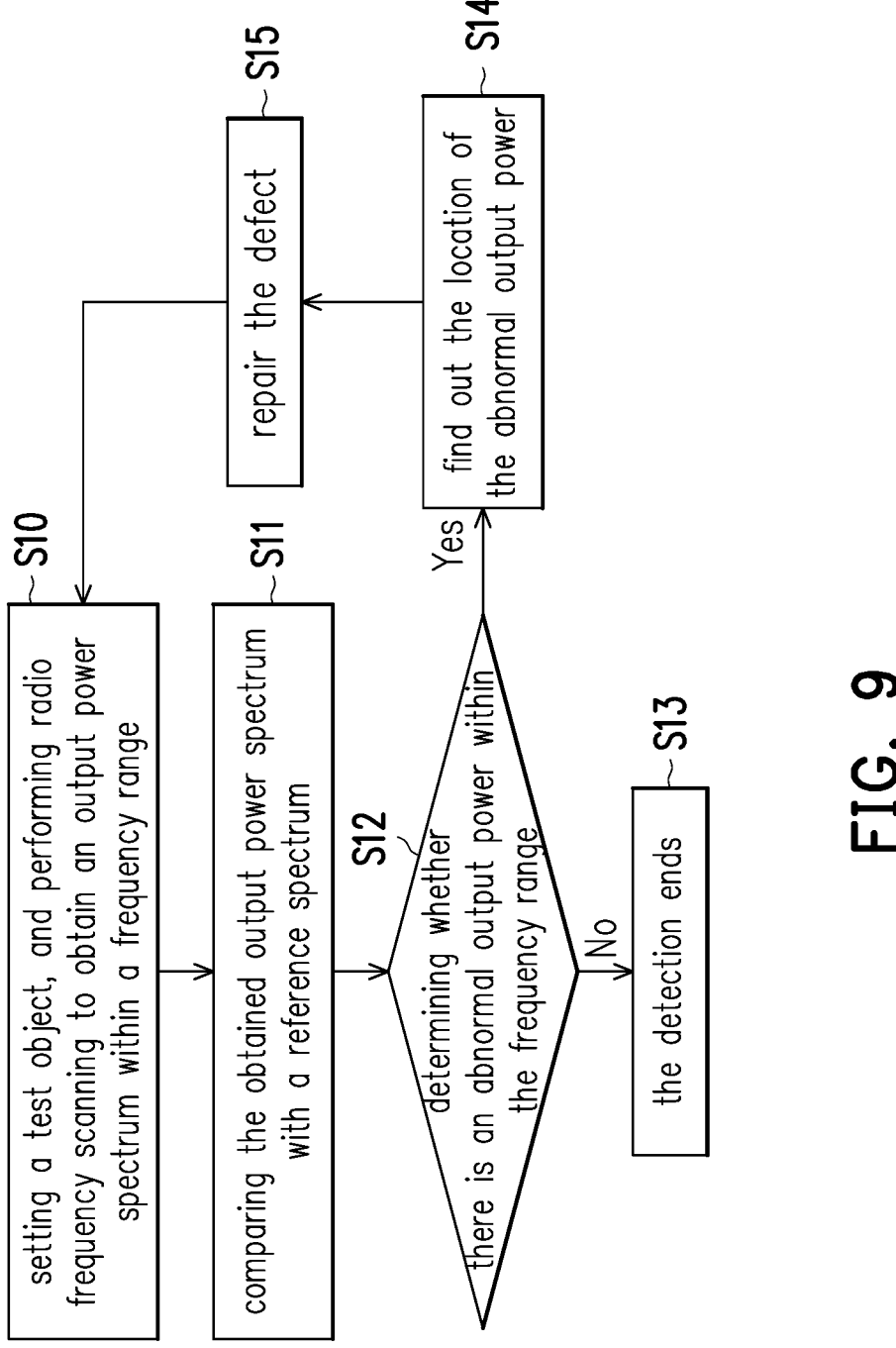
FIG. 9 and FIG. 10 are respectively various detection methods according to different embodiments of the present disclosure.
Figure 10:
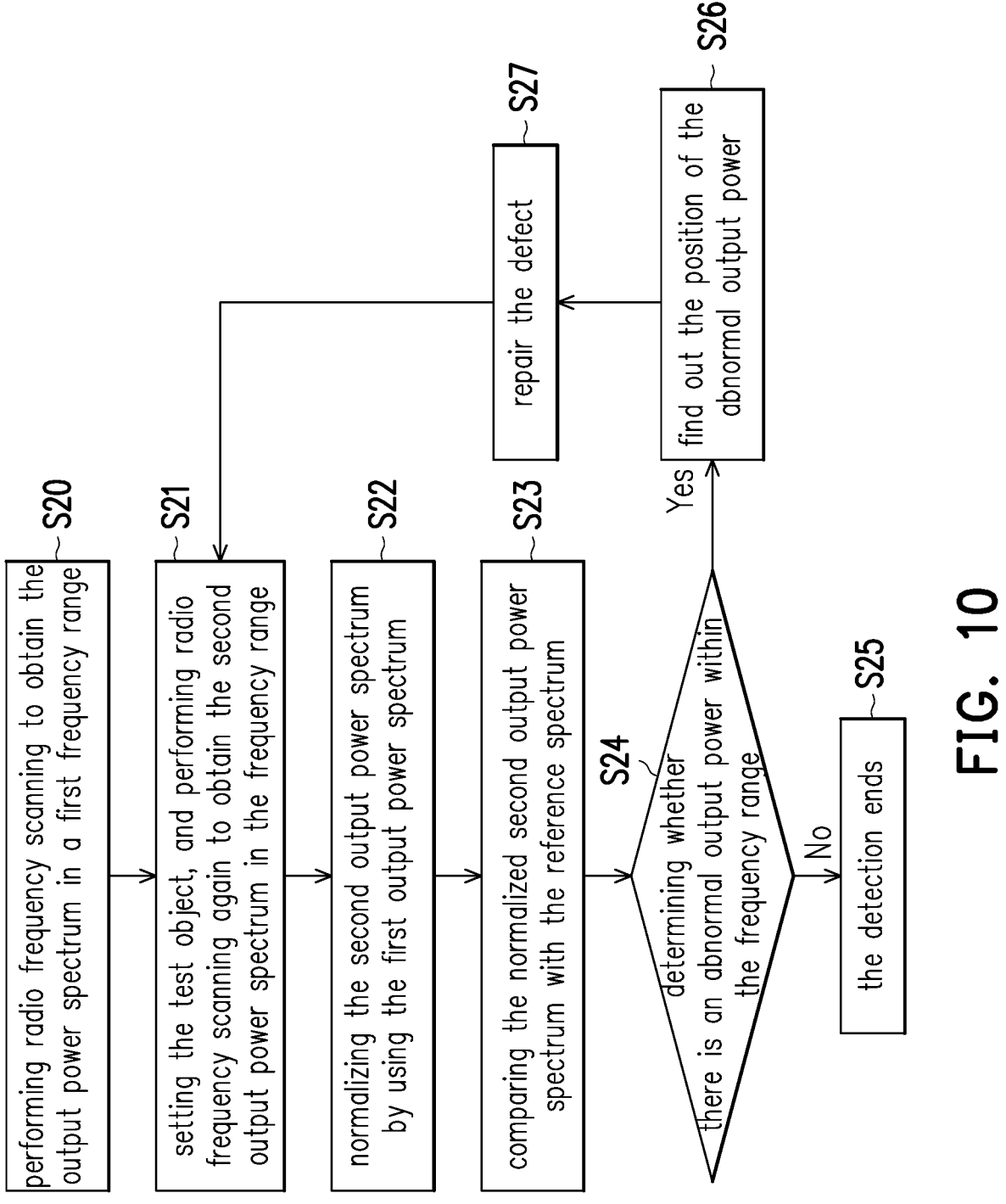

FIG. 9 and FIG. 10 are respectively various detection methods according to different embodiments of the present disclosure. Please refer to FIG. 9 first, the detection method of the detection device may include: setting a test object, and performing radio frequency scanning to obtain an output power spectrum within a frequency range (step S10). For example, a test object (such as test object 3 or test object 3D) and a detection device may be set up as shown in FIG. 1 to FIG. 8, and then radio frequency scanning is performed. Radio frequency scanning may include providing an initial electromagnetic wave signal E of different frequencies to an device area of the test object (referring to the area where multiple electronic elements 30 are set), so as to obtain the output power spectrum of the area in the corresponding frequency range, for example, to obtain the graph of frequency and output power. If a coverage area of the initial electromagnetic wave signal E is smaller than the device area of the test object, the device area may be divided into multiple sub-areas, and the RF scanning is performed on multiple sub-areas in order to obtain the output power spectrum of each sub-area within the corresponding frequency range.

The detection method of the detection device may further include: comparing the obtained output power spectrum with a reference spectrum (step S11); and determining whether there is an abnormal output power within the frequency range (step S12). For example, the output power spectrum obtained in step S10 may be compared with the reference spectrum stored in the processor to determine whether there is an increase in the intensity of the resonant frequency point due to abnormal contact (abnormal output power). If the output power spectrum has the same or similar curve distribution as the reference spectrum, it is determined that there is no abnormal output power. On the other hand, if the output power spectrum has a curve distribution different from the reference spectrum, for example, the output power spectrum has a significant output power at an unexpected frequency, causing the number of peaks in the output power spectrum is more than the number of peaks in the reference spectrum, then it is determined that there is an abnormal output power.

If there is no abnormal output power, the detection ends (step S13). If there is an abnormal output power, an operation is performed to find out the location of the abnormal output power (step S14). For example, after determining which sub-area of the device area has an abnormal output power, the defect location may be obtained more accurately through the structure in FIG. 2, FIG. 4 or FIG. 8, and then the defect may be repaired (step S15). After repairing the defect (step S15), the operation may return to step S10. By detecting the contact status of multiple electronic elements in the test object while determining the high-frequency characteristics of the test object, the inspection time may be shortened, and when a defect is identified, feedback or repair may be performed in time.

Please refer to FIG. 10, the detection method of the detection device may include: performing radio frequency scanning to obtain the first output power spectrum in a frequency range (step S20); setting the test object, and performing radio frequency scanning again to obtain the second output power spectrum in the frequency range (step S21); normalizing the second output power spectrum by using the first output power spectrum (step S22); comparing the normalized second output power spectrum with the reference spectrum (step S23); determining whether there is an abnormal output power within the frequency range (step S24); if there is no abnormal output power, the detection ends (step S25). If there is an abnormal output power, an operation is performed to find out the position of the abnormal output power (step S26), then defect is repaired (step S27), return to step S21 after defect is repaired (step S27).

In detail, both step S20 and step S21 measure the output power under the condition that the same input signals are provided (phase, frequency, amplitude, etc. of the initial electromagnetic wave signal E are all fixed), and the difference between the two steps is that, in step S20, the output power spectrum is measured as the reference output power spectrum in absence of the test object, whereas in step S21, the output power spectrum is measured in presence of the test object. By normalizing the second output power spectrum (that is, dividing the second output power spectrum by the first output power spectrum), and comparing the normalized second output power spectrum with the reference spectrum, it is possible to reduce misjudgment caused by unstable input signal. Steps S24 to S27 are similar to the aforementioned steps S12 to S15, please see the previous descriptions for reference, and the details will not be repeated here.

Based on the above, in the embodiment of the present disclosure, the output electromagnetic wave signal is detected by the detection device to determine whether there is an increase in the intensity of the resonant frequency point due to the abnormal contact, and it is possible to determine the high-frequency characteristics of the test object while detecting poor contact or misalignments, so that feedback or repair may be performed in time.

The above embodiments are only used to illustrate the technical solutions of the present disclosure, rather than to limit them; although the present disclosure has been described in detail with reference to the foregoing embodiments, those of ordinary skill in the art should understand that: they may still make modification to the technical solutions described in the foregoing embodiments, or some or all of the technical features may be replaced equivalently; and these modifications or replacements do not make the essence of the corresponding technical solutions depart from the scope of the technical solutions of the embodiments disclosed in this disclosure.

Although the embodiments of the disclosure and their advantages have been disclosed above, it should be understood that any person with ordinary knowledge in the technical field may make changes, substitutions and retouching without departing from the spirit and scope of the disclosure, and the features of various embodiments can be freely mixed and replaced to form other new embodiments. In addition, the protection scope of the present disclosure is not limited to the process, machine, manufacture, material composition, device, method and steps in the specific embodiments described in the specification. Anyone with ordinary knowledge in the technical field can understand that the current or future developed processes, machines, manufacturing, material compositions, devices, methods and steps from the content of this disclosure may be used according to the disclosure as long as they can be implemented in the embodiments described herein with same function or achieving substantially the same result. Therefore, the protection scope of the present disclosure includes the above-mentioned process, machine, manufacture, composition of matter, device, method and steps. In addition, each claim constitutes an individual embodiment, and the protection scope of the present disclosure also includes combinations of the individual claims and the embodiments. The scope of protection of this disclosure should be defined by the appended claims.

What is claimed is:

1. A detection device, configured to detect an output electromagnetic wave signal passing through a test object, and comprising:
    an electromagnetic wave signal generating unit, configured to generate an initial electromagnetic wave signal;
    an output element, configured to output the initial electromagnetic wave signal, wherein the output element comprises at least one transmitting antenna;
    a receiving element, configured to receive the output electromagnetic wave signal, wherein the receiving element comprises at least one receiving antenna; and
    a measuring unit, configured to measure a value of the output electromagnetic wave signal, wherein the measuring unit comprises a radio frequency power meter, the test object is disposed between the output element and the receiving element, and the initial electromagnetic wave signal transmitted from the output element to the test object is converted into the output electromagnetic wave signal by an electronic element in the test object when passing through the test object.

2. The detection device according to claim 1, further comprising:
    a first lens unit, disposed between the output element and the receiving element;
    a second lens unit, disposed between the first lens unit and the receiving element; and
    a third lens unit, disposed between the second lens unit and the receiving element.

3. The detection device according to claim 2, further comprising:
    a filter unit, disposed between the third lens unit and the receiving element.

4. The detection device according to claim 1, wherein the output element comprises a plurality of output units, and the receiving element comprises a plurality of receiving units.

5. The detection device according to claim 4, further comprising:
    a phase adjustment element, disposed at least one of the following positions:
    between the output element and the electromagnetic wave signal generating unit; and
    between the receiving element and the measuring unit.

6. The detection device according to claim 1, further comprising:
    a processor, coupled to the electromagnetic wave signal generating unit and the measuring unit.

7. The detection device according to claim 6, further comprising:
    a first signal line, coupled between the processor and the electromagnetic wave signal generating unit; and
    a second signal line, coupled between the processor and the measurement unit.

8. The detection device according to claim 1, further comprising:
    a third signal line, coupled between the electromagnetic wave signal generating unit and the output element; and a fourth signal line, coupled between the receiving ele-
    ment and the measuring unit.

<div align="center">* * * * *</div>